US008353718B2

(12) United States Patent
Hensley et al.

(10) Patent No.: US 8,353,718 B2
(45) Date of Patent: Jan. 15, 2013

(54) HANDLE ASSEMBLY FOR ELECTRICAL CONNECTION WITH A GROUNDING MECHANISM

(75) Inventors: James D. Hensley, Rocklin, CA (US); David R. Cowles, Granite Bay, CA (US); David L. Mallery, Roseville, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 110 days.

(21) Appl. No.: 12/971,090

(22) Filed: Dec. 17, 2010

(65) Prior Publication Data
US 2012/0156922 A1 Jun. 21, 2012

(51) Int. Cl.
*H01R 13/00* (2006.01)
(52) U.S. Cl. .................................... 439/476.1
(58) Field of Classification Search ............... 439/476.1, 439/152, 108, 160, 157; 361/818, 799, 801, 361/415, 798
See application file for complete search history.

(56) References Cited

U.S. PATENT DOCUMENTS

| 4,564,250 | A | * | 1/1986 | Klein et al. | 439/108 |
|---|---|---|---|---|---|
| 4,894,753 | A | * | 1/1990 | Wadell et al. | 361/818 |
| 4,996,631 | A | * | 2/1991 | Freehauf | 361/798 |
| 5,386,346 | A | * | 1/1995 | Gleadall | 361/799 |
| 5,896,273 | A | | 4/1999 | Varghese | |
| 6,172,880 | B1 | * | 1/2001 | Petitpierre et al. | 361/801 |
| 6,603,657 | B2 | | 8/2003 | Tanzer | |
| 6,752,641 | B2 | * | 6/2004 | Puri et al. | 439/157 |
| 7,229,317 | B2 | | 6/2007 | Togami | |
| 7,252,521 | B2 | | 8/2007 | Song | |

* cited by examiner

*Primary Examiner* — Alexander Gilman

(57) ABSTRACT

A handle assembly is for use with an electronic device having a chassis, where at least a portion of the handle assembly is part of a path that crosses through the chassis. The handle assembly has a handle member moveable with respect to the chassis, wherein the handle member has a profile to allow for gripping by a user to move the electronic device. The handle assembly has an electrical contact to make electrical connection with the grounding mechanism of the chassis upon the handle member being moved to a first position.

14 Claims, 4 Drawing Sheets

HANDLE ASSEMBLY FOR ELECTRICAL CONNECTION WITH A GROUNDING MECHANISM

BACKGROUND

An electronic device can have various electronic components that operate at relatively high frequencies. If steps are not taken to properly prevent electromagnetic (EM) energy from radiating from within the chassis of the electronic device to outside the chassis, the radiated EM energy can cause electromagnetic interference with other electronic devices.

BRIEF DESCRIPTION OF THE DRAWINGS

Some embodiments are described with respect to the following figures.

DETAILED DESCRIPTION

Some electronic devices are mountable into a larger system, such as a system having a rack including rack slots for receiving respective ones of the electronic devices. Examples of such electronic devices include server computers, storage devices, communications devices, or other types of devices. Often, the electronic devices have connectors that are to be engaged with corresponding mating connectors of the system. To insert or remove an electronic device into or from the system, a user typically has to overcome insertion and removal forces associated with the connectors as well as other forces (such as frictional forces).

To allow the user to apply the insertion or removal force to insert or remove an electronic device into or from the system, the electronic device can be provided with a handle assembly that is grippable by the user to apply the desired force. The presence of the handle assembly also makes it more convenient for the user to transport the electronic device.

Often, a handle member of the handle assembly of an electronic device is formed of a relatively rigid material such as metal, which is electrically conductive. In some arrangements, the handle assembly (or a larger subsystem that the handle assembly is part of) can penetrate through a chassis of the electronic device. For example, a portion of the handle assembly can pass through an opening in the chassis to allow for the handle assembly to be attached inside the chassis. In other examples, the handle assembly can be attached by an attachment mechanism that has a member (e.g., screw or other like attachment member) that penetrates the chassis.

The penetration of the electronic device chassis by the handle assembly (or a larger subsystem including the handle assembly) results in a path crossing through the chassis, where this path can allow for electromagnetic (EM) energy to cross from the inside of the chassis to the outside of the chassis (where the "outside" of the chassis refers to the environment surrounding the chassis that is separated from the chassis inner volume by the chassis). If the handle member of the handle assembly is formed of an electrically conductive material, such as metal, then the handle member can effectively act as an antenna to radiate EM energy to the outside of the electronic device chassis. The radiated EM energy can cause electromagnetic interference with other electronic devices.

Figure 1:
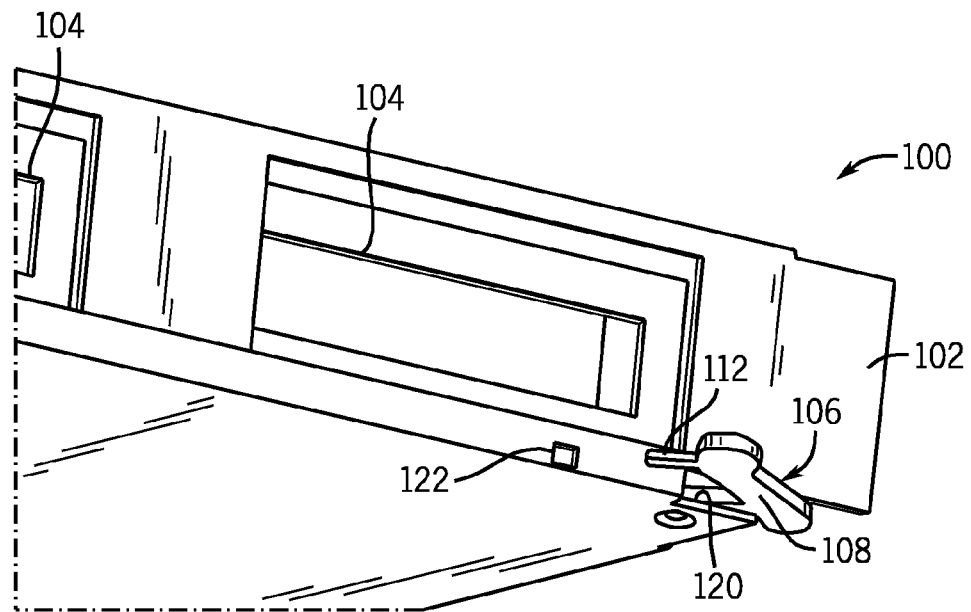
FIGS. 1-3 are perspective views of portions of an electronic device incorporating an electromagnetic (EM) radiation protection mechanism according to some implementations.
Figure 2:
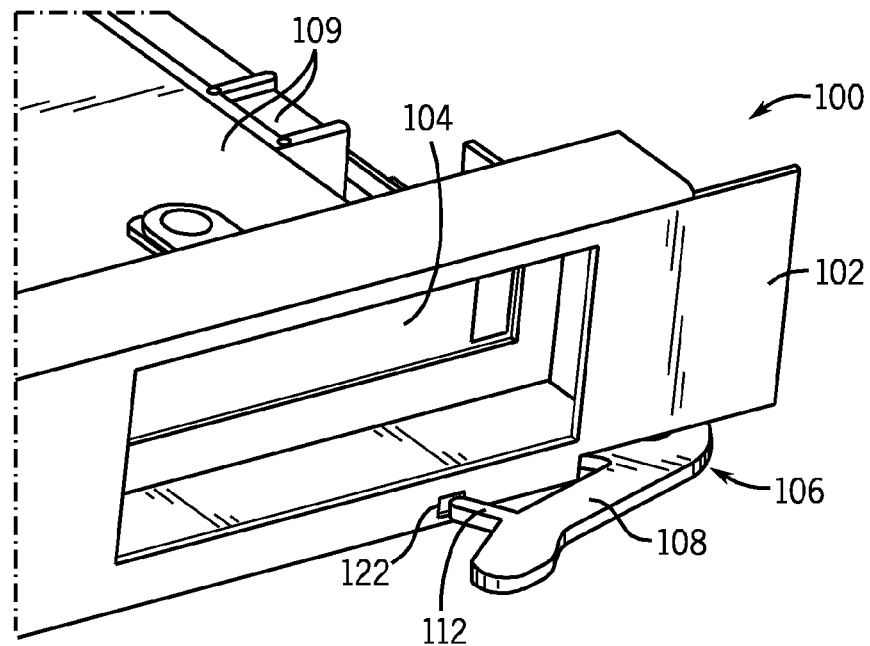
Figure 3:
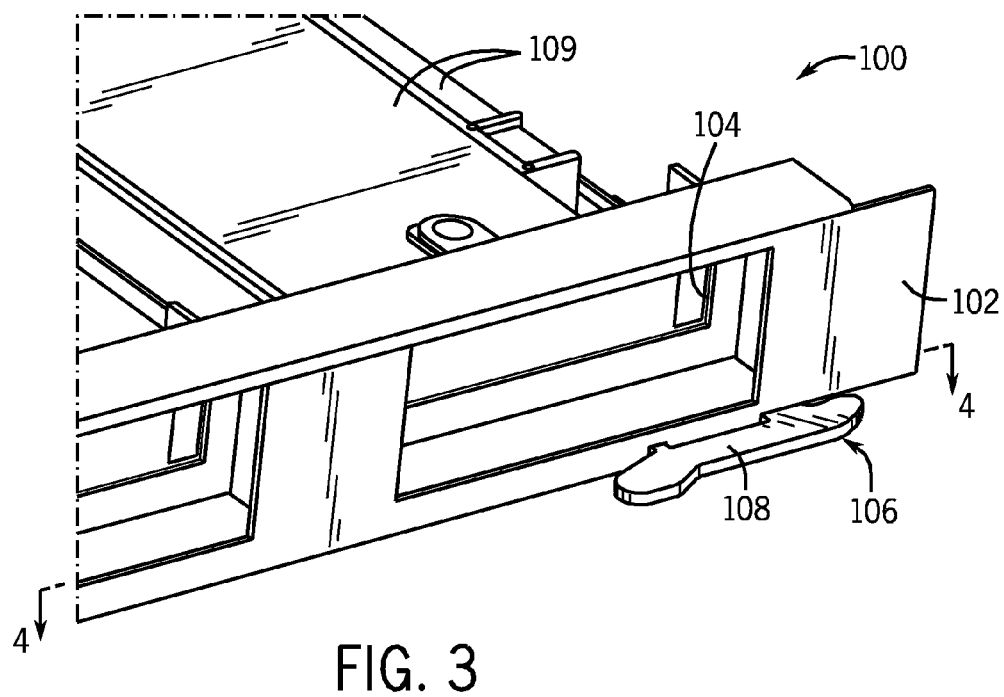
Figure 4:
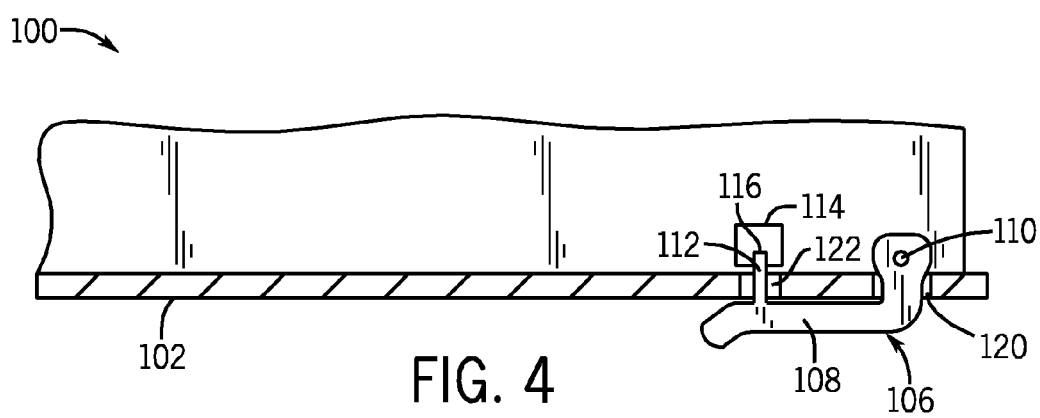
FIG. 4 is a top cross-sectional view of a portion of the electronic device of FIGS. 1-3.

FIGS. 1-4 depict portions of an electronic device 100 having a handle assembly according to some implementations. FIGS. 1 and 2 are different perspective views of the electronic device 100 with the handle assembly in an extended state, while FIG. 3 is a perspective view of the electronic device 100 with the handle assembly in a retracted state. FIG. 4 is a top cross-sectional view of a portion of the electronic device 100 of FIG. 3.

In FIG. 2, a portion of the external chassis of the electronic device 100 has been removed in the drawing to allow components within an inner volume of the electronic device 100 to be visible. The chassis of the electronic device 100 includes a front panel 102 that has slots or receptacles 104 to receive or connect to respective external devices. In other examples, instead of being provided with the slots or receptacles 104, the front panel 102 can be provided with connectors, or alternatively, the front panel 102 is not provided with connectors, slots, or receptacles.

The inner volume of the electronic device 100 (which is contained within the outer chassis of the electronic device 100) contains various equipment 109, including electronic components that may operate at relatively high frequencies. Other types of equipment 109 that can be included in the inner volume of the chassis include a power supply, heat sink, a circuit board, and so forth.

Also depicted is a handle assembly 106, which has a handle member 108 that has a profile that is grippable by a user to allow the user to apply force on the handle member 108 to move the electronic device 100, such as to insert the electronic device 100 into a larger system, remove the electronic device 100 from such larger system, or transport the electronic device 100 between different locations.

As shown in FIGS. 1 and 2, the handle assembly 106 is in its extended state, where the handle member 108 has moved to one position (extended position) that is spaced apart from the front panel 102 of the electronic device 100, such that a user can more easily grip the handle member 108.

On the other hand, FIG. 3 shows the handle assembly 106 in its retracted state, where the handle member 108 has been moved to a different position (retracted position) that is closer to the front panel 102. The handle assembly 106 is provided in its retracted state during actual operation of the electronic device 100, where the electronic device 100 is powered and performing respective tasks of the electronic device 100. Thus, the handle member 108 is movable between an extended position (associated with the extended state of the handle assembly 106) and a retracted position (associated with the retracted state of the handle assembly 106).

FIG. 4 is a top cross-sectional view of a portion of the electronic device 100 depicted in FIG. 3 (along section 4-4). As further depicted in FIG. 4, the handle assembly 106 includes a connection member 110 which attaches the handle assembly 106 to the chassis of the electronic device 100. The handle member 108 is movably coupled to the connection member 110. In examples according to FIG. 4, the handle member 108 is pivotably movable about the connection member 110 between different positions associated with the extended and retracted states of the handle assembly 106. In alternative examples, the handle member 108 can be slidably movable between different positions. In yet other examples, other relative movements between the handle member 108 and the connection member 110 are possible.

In examples according to FIG. 4, the connection member 110 is provided within the inner volume of the chassis of the electronic device 100. The connection member 110 can be attached to the chassis by any of various mechanisms, such as a screw or other type of attachment mechanism.

As shown in FIGS. 1-4, the handle assembly 106 also includes an electrical contact 112 on the handle member 108 to allow for electrical connection of the handle member 108 to a grounding mechanism 114 of the electronic device 100. In examples according to those depicted in FIGS. 1-4, the electrical contact 112 is in the form of a tab that protrudes from the handle member 108. The tab 112 being "on" the handle member 108 can refer to the tab 112 being distinct from but attached to the handle member 108, or alternatively, the tab 112 being integrally formed with the handle member 108.

Upon the handle member 108 moving to its retracted position associated with the retracted state of the handle assembly 106, the tab 112 engages the grounding mechanism 114. In some examples, the grounding mechanism 114 can have a slot or receptacle 116 to receive the tab 112, thereby making electrical connection between the tab 112 and the grounding mechanism 114. The tab 112 can be formed of the same material as the handle member 108, such as a metal or other electrically conductive material. Alternatively, the tab 112 can be formed of an electrically conductive material different from a material of the handle member 108.

By making electrical connection between the tab 112 and the grounding mechanism 114, the handle member 108 is effectively grounded so that the handle member 108 cannot act as a single-pole antenna, but rather becomes part of a relatively short loop with a conductive path back to a ground connection, in this case the grounding mechanism 114 inside the inner volume of the chassis of the electronic device 100. As a result, EM radiation from the handle member 108 is avoided or reduced. The combination of the electrical contact 112 of the handle assembly 106 and the grounding mechanism 114 provides an EM radiation protection mechanism.

The grounding mechanism 114 can be formed of a block of electrically conductive material that is electrically connected to a ground reference of the electronic device 100. The block making up the grounding mechanism 114 can provide the receptacle 116 to receive the tab 112. Alternatively, the grounding mechanism 114 can be any other structure that is electrically connectable to the electrical contact 112 of the handle assembly 106. Such other structure can include an electrically conductive metal strip, an EMI (electromagnetic interference) gasket formed of electrically conductive material, or any other electrically conductive structure that is connected to a ground reference.

As shown in FIGS. 1 and 4, the handle assembly 106 extends or crosses through a boundary of the electronic device chassis (in this example the front panel 102 of the chassis). An opening 120 is provided in the front panel 102 of the electronic device 100, where a portion of the handle member 108 extends through such opening 120. This opening 120 is part of a path that crosses the electronic device chassis, which can allow EMI energy to pass through the chassis if the handle assembly 106 is not properly provided with an EM radiation protection mechanism according to some implementations.

In the retracted state of the handle assembly 106, the tab 112 of the handle assembly 106 passes through a second opening 122 in the front panel 102 of the electronic device chassis, to allow for the tab 112 to make electrical connection with the grounding mechanism 114 inside the inner volume of the electronic device chassis.

Although FIGS. 1-4 depict the handle assembly 106 having portions passing thorough openings in the front panel 102 of the electronic device chassis, in other examples, the portions of the handle assembly 106 can pass through openings on other sides of the electronic device chassis.

Figure 5:
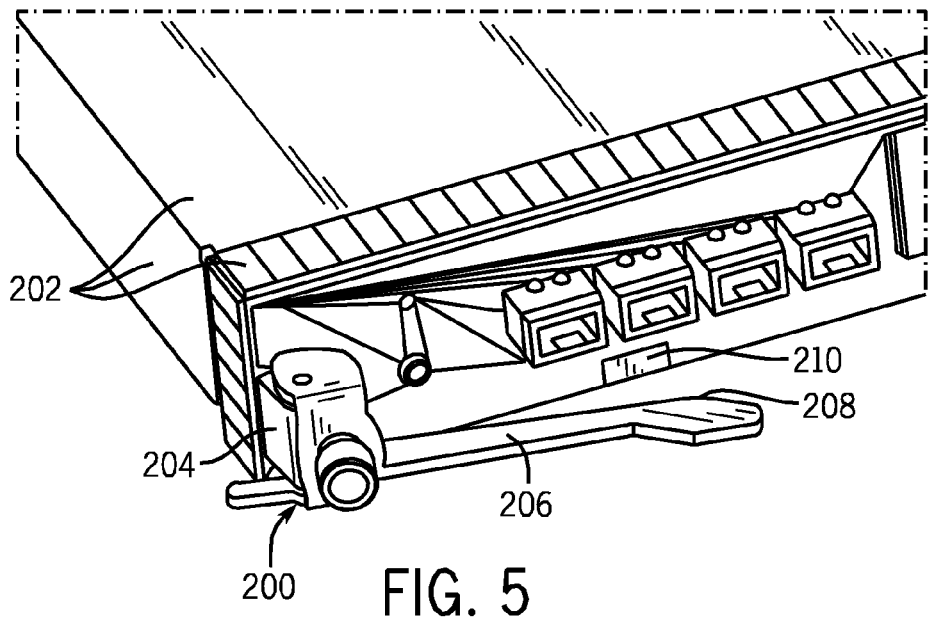
FIGS. 5 and 6 are perspective views of a portion of an electronic device incorporating an EM radiation protection mechanism according to alternative implementations.
Figure 6:
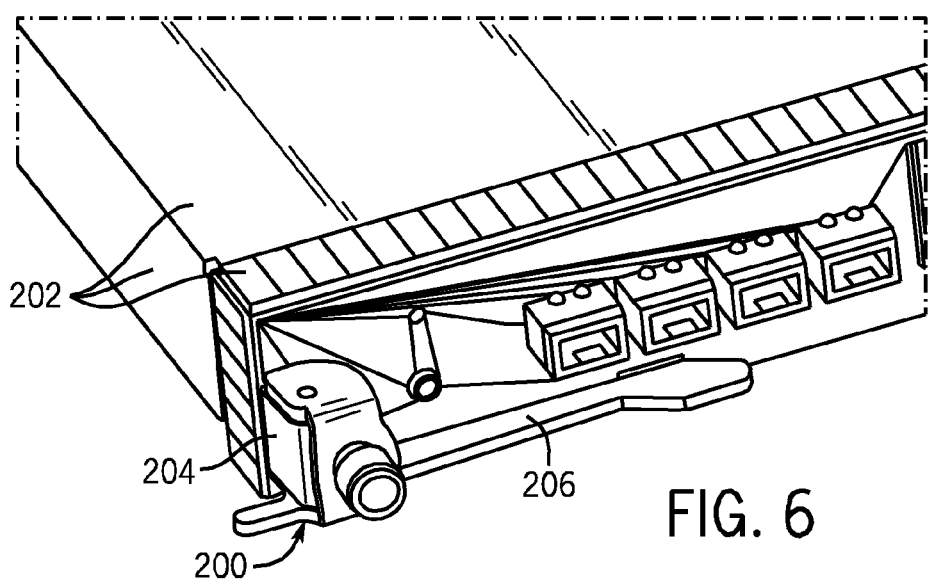

FIGS. 5 and 6 depict an electronic device having a handle assembly 200 according to alternative implementations. While the handle assembly 106 of FIGS. 1-4 has portions that cross a boundary of the electronic device chassis, the handle assembly 200 depicted in FIGS. 5 and 6 is located on the outside of an electronic device chassis 202 shown in FIGS. 5 and 6. The handle assembly 200 still is considered to be part of a path that crosses the electronic device chassis 202, since a connection member 204 of the handle assembly 200 is attached by an attachment mechanism that crosses the electronic device chassis 202. For example, the attachment mechanism can be a screw that passes through an opening of the electronic device chassis 202 to connect the connection member 204 to the electronic device chassis 202.

The handle assembly 200 of FIGS. 5 and 6 includes a handle member 206 that is movable between different positions associated with respective extended and retracted states of the handle assembly 200. The handle member 206 is movably coupled to the connection member 204. In the examples depicted in FIGS. 5 and 6, the handle member 206 is pivotably mounted to the connection member 204 to allow for pivoting of the handle member 206 between different positions. In other examples, other relative motions between the handle member 106 and connection member 204 are possible.

FIG. 5 shows the handle member 206 in a position associated with the extended state of the handle assembly 200, where the handle member 206 is extended away from the front of the electronic device chassis 202 to allow for gripping of the profile of the handle member 206 by a user to move the electronic device. FIG. 6 depicts the handle member 206 being in a position associated with the retracted state of the handle assembly 200, where the handle member 206 is moved closer to the front of the electronic device chassis 202.

The handle member 206 has a portion that is considered an electrical contact 208 of the handle assembly 200, where this electrical contact 208 is positioned to make an electrical connection to a grounding mechanism 210 (in the form of a grounding contact, for example) provided on the front panel of the electronic device chassis 202. The grounding mechanism 210 can be formed of an electrically conductive material such as an EMI gasket, a metallic strip, or other type of material. The grounding mechanism 210 is electrically connected to a ground reference of the electronic device.

FIG. 6 shows the electrical contact 208 of the handle member 206 making electrical connection with the grounding mechanism 210.

In other examples, different implementations of the grounding mechanism 210 can include a slot or receptacle, or alternatively, a protruding element, to make corresponding electrical connection with the electrical contact 208 of the handle assembly 200.

Figure 7:
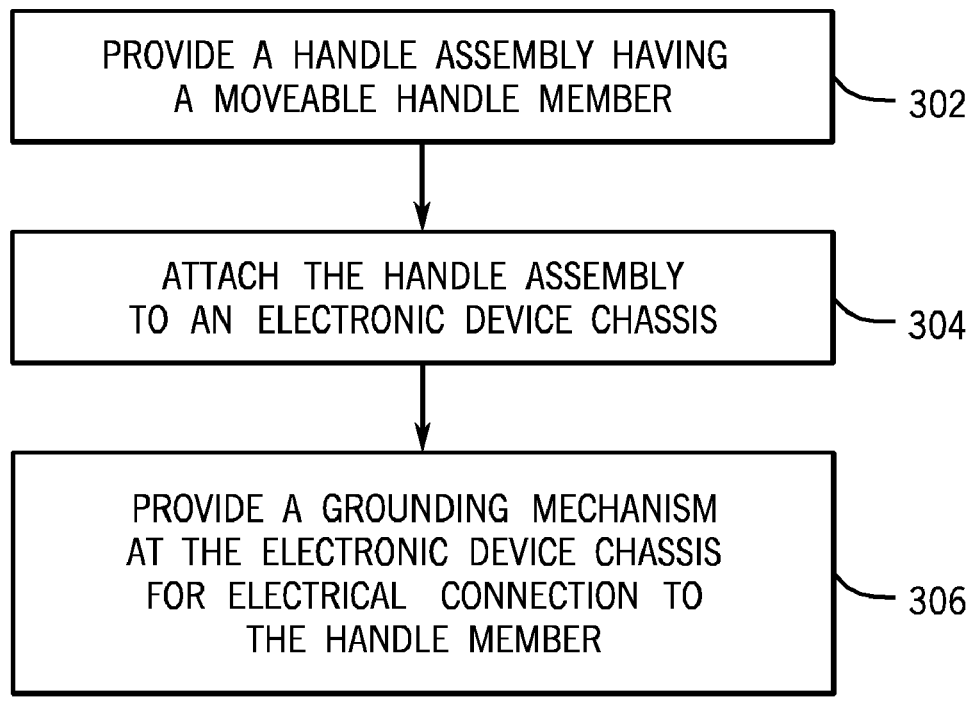
FIG. 7 is a flow diagram of a process to provide an EM radiation protection mechanism for an electronic device, in accordance with some implementations.

FIG. 7 is a flow diagram of a process to provide an EMI radiation protection mechanism for an electronic device, in accordance with to some implementations. A handle assembly is provided (at 302) that has a handle member moveable between a retracted position and an extended position relative to a chassis of an electronic device, wherein the handle assembly is part of a path that crosses through the chassis. The handle assembly is attached (at 304) to the electronic device chassis.

A grounding mechanism is provided (at 306) at the chassis, wherein the grounding mechanism is electrically connected to the handle member when the handle member is in the retracted position, and wherein the grounding mechanism is spaced apart from the handle member when the handle member is in the extended position.

During use of the electronic device, a user can move the electronic device by moving the handle member of the handle assembly to the extended position (away from the electronic device chassis, as shown in FIG. 1 or 5, for example).

Once the handle member has been extended away from the electronic device chassis, a user can grip the gripping profile of the handle member to move the electronic device, where moving the electronic device can include inserting the electronic device, removing the electronic device, or otherwise transporting the electronic device.

After the electronic device has been inserted into a larger system, such as within a rack, the handle member of the handle assembly is retracted to cause electrical connection to be made between the electrical contact of the handle assembly and a grounding mechanism of the electronic device (as shown in FIG. 3 or 6, for example). Then, the electronic device can be operated with the handle assembly in its retracted state, where EM radiation protection is provided due to the electrical connection between the electrical contact of the handle assembly and the grounding mechanism of the electronic device.

In the foregoing description, numerous details are set forth to provide an understanding of the subject disclosed herein. However, implementations may be practiced without some or all of these details. Other implementations may include modifications and variations from the details discussed above. It is intended that the appended claims cover such modifications and variations.

What is claimed is:

1. A handle assembly for use with a chassis of an electronic device, comprising:
   a connection member to attach to the chassis of the electronic device;
   a handle member moveably coupled to the connection member, wherein the handle member has a profile to allow for gripping by a user to move the electronic device, wherein upon the handle assembly being attached to the chassis at least a portion of the handle assembly is part of a path that crosses through the chassis; and
   an electrical contact on the handle member to make electrical connection with a grounding mechanism of the chassis upon the handle member being moved to a first position
   wherein the electrical contact is to make electrical connection with the grounding mechanism on an exterior surface of the chassis upon the handle member moving to the first position.

2. The handle assembly of claim 1, wherein the handle member is pivotably coupled to the connection member, and wherein the handle member is pivotable between the first position and a second position, wherein in the second position the electrical contact on the handle member is spaced apart from the grounding mechanism.

3. The handle assembly of claim 1, wherein the protruding tab is to extend through an opening in the chassis upon the handle member moving to the first position.

4. The handle assembly of claim 1, wherein the electrical contact is to make electrical connection with the grounding mechanism that includes a ground contact on the exterior surface of the chassis.

5. The handle assembly of claim 1, wherein the handle member is moveable between the first position and a second position, and wherein in the second position the handle member is configured to be gripped by the user.

6. The handle assembly of claim 5, wherein the handle member is spaced apart from the chassis by a greater distance when the handle member is in the second position than when the handle member is in the first position.

7. A method comprising:
   providing a handle assembly having a handle member moveable between a refracted position and an extended position relative to a chassis of an electronic device, wherein the handle assembly is part of a path that crosses through the chassis; and
   providing a grounding mechanism on an exterior surface of the chassis, wherein the grounding mechanism is electrically connected to the handle member when the handle member is in the retracted position, and wherein the grounding mechanism is spaced apart from the handle member when the handle member is in the extended position.

8. The method of claim 7, further comprising:
   attaching a connection member of the handle assembly to the chassis, wherein the handle member is moveable with respect to the connection member.

9. The method of claim 8, wherein attaching the connection member comprises attaching the connection member inside an inner volume of the chassis, and wherein a portion of the handle member passes through an opening of the chassis between the inner volume and an outside of the chassis.

10. The method of claim 8, wherein attaching the connection member comprises attaching the connection member to an exterior surface of the chassis using an attachment mechanism, wherein the attachment mechanism crosses through the chassis.

11. An electronic module comprising:
   a chassis having an inner volume and a grounding mechanism on an exterior surface of the chassis;
   equipment in the inner volume; and
   a handle assembly attached to the chassis, wherein at least a portion of the handle assembly is part of a path that crosses through the chassis, and wherein the handle assembly comprises:
      a handle member moveable with respect to the chassis, wherein the handle member has a profile to allow for gripping by a user to move the electronic device; and
      an electrical contact to make electrical connection with the grounding mechanism of the chassis upon the handle member being moved to a first position, wherein the electrical connection of the electrical contact with the grounding mechanism causes electrical connection of the handle member to the grounding mechanism.

12. The electronic device of claim 11, wherein the chassis has an opening extending between the inner volume and an outside of the chassis, and wherein a portion of the handle member extends through the opening.

13. The electronic device of claim 11, wherein the handle assembly is attached to an exterior surface of the chassis.

14. The electronic device of claim 11, wherein the handle member is moveable between the first position and a second position, and wherein in the second position the handle member is configured to be gripped by the user.

* * * * *